United States Patent
Ng et al.

(10) Patent No.: US 9,047,934 B1
(45) Date of Patent: Jun. 2, 2015

(54) TIMING SIGNAL ADJUSTMENT FOR DATA STORAGE

(71) Applicant: Altera Corporation, San Jose, CA (US)

(72) Inventors: Bee Yee Ng, Bayan Lepas (MY); Hee Kong Phoon, Bagan Serai (MY); Beng Lee Ooi, Kangar (MY)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 14/079,306

(22) Filed: Nov. 13, 2013

(51) Int. Cl.
*G11C 7/10* (2006.01)
*G11C 7/22* (2006.01)

(52) U.S. Cl.
CPC .............. *G11C 7/222* (2013.01); *G11C 7/1084* (2013.01); *G11C 7/225* (2013.01)

(58) Field of Classification Search
CPC .... G11C 7/22; G11C 11/4076; G11C 11/409; G11C 11/413; G11C 7/1072; G11C 7/1078; G11C 7/109; G11C 7/227
USPC .............. 365/194, 191, 210.1, 233.5, 189.02, 365/189.05, 203, 23.16, 23.163
See application file for complete search history.

(56) References Cited

U.S. PATENT DOCUMENTS

| 2012/0087452 A1 | 4/2012 | Zerbe et al. |
| 2013/0009686 A1 | 1/2013 | Bucher |
| 2014/0293710 A1* | 10/2014 | Ware et al. ............... 365/189.02 |

FOREIGN PATENT DOCUMENTS

WO    2013066774    5/2013

OTHER PUBLICATIONS

Samta Bansal, "3D IC Design," EE Times, Sep. 14, 2011, pp. 1-8.
Altera Corporation, "External Memory Interfaces in Cyclone V," May 6, 2013, pp. 1-38.
Altera Corporation, "External Memory Interfaces in Stratix V," Dec. 28, 2012, pp. 1-29.
Altera Corporation, "External Memory Interfaces in Stratix & Stratix GX Devices," Stratix Device Handbook, vol. 2, Jun. 2006, pp. 1-28.

* cited by examiner

*Primary Examiner* — Thong Q Le
(74) *Attorney, Agent, or Firm* — Steven J. Cahill (57) ABSTRACT

An integrated circuit includes a delay circuit, a buffer circuit, and a storage circuit. The delay circuit delays a first timing signal to generate a second timing signal. The buffer circuit generates a third timing signal for transmission to an external device. The third timing signal is generated based on the first timing signal. The external device provides data to the integrated circuit based on the third timing signal. The storage circuit captures the data transmitted from the external device in response to the second timing signal.

20 Claims, 8 Drawing Sheets

TIMING SIGNAL ADJUSTMENT FOR DATA STORAGE

FIELD OF THE DISCLOSURE

The present disclosure relates to electronic circuits, and more particularly, to techniques for adjusting a timing signal for data storage.

BACKGROUND

A memory system may include a memory controller and a memory circuit. The memory controller is a circuit that manages the flow of data transmitted to and from the memory circuit. The memory controller circuit and the memory circuit are in different integrated circuits. A memory controller can be a stand-alone integrated circuit or part of another integrated circuit.

In a typical memory system, the memory controller circuit stores data in the memory circuit during write operations. The memory controller circuit accesses data stored in the memory circuit during read operations. In a source synchronous system, a timing signal is transmitted between the memory controller circuit and the memory circuit along with the data during both read and write operations.

BRIEF SUMMARY

According to some embodiments, an integrated circuit includes a delay circuit, a buffer circuit, and a storage circuit. The delay circuit delays a first timing signal to generate a second timing signal. The buffer circuit generates a third timing signal for transmission to an external device. The third timing signal is generated based on the first timing signal. The external device provides data to the integrated circuit based on the third timing signal. The storage circuit captures the data transmitted from the external device in response to the second timing signal.

Various objects, features, and advantages of the present invention will become apparent upon consideration of the following detailed description and the accompanying drawings.

DETAILED DESCRIPTION

In many types of circuit systems, data is transmitted between two or more integrated circuits. Data can be transmitted between first and second integrated circuits with or without a timing signal. In a source synchronous system or mode of operation, a timing signal is transmitted along with data that is sent from the first integrated circuit to the second integrated circuit, and a timing signal is transmitted along with data that is sent from the second integrated circuit to the first integrated circuit.

In a fully synchronous system or mode of operation, a timing signal is transmitted along with data that is sent from the first integrated circuit to the second integrated circuit, but a timing signal is not transmitted along with data that is sent from the second integrated circuit to the first integrated circuit. As an example, in a memory system that is operated in a fully synchronous mode, a timing signal is transmitted along with the write data that is sent from the memory controller circuit to the memory circuit, but a timing signal is not transmitted along with the read data that is sent from the memory circuit to the memory controller circuit. A storage circuit in the memory controller circuit captures the read data in response to a read timing signal that is generated and transmitted entirely within the integrated circuit where the memory controller circuit is located.

The read data path may be the critical path for meeting the setup time of the storage circuit that captures the read data in the memory controller circuit during fully synchronous mode. In some embodiments disclosed herein, a timing signal adjustment circuit adjusts the read timing signal used to capture the read data in the memory controller circuit in order to satisfy timing specifications of the memory system. The timing signal adjustment circuit can be used to delay the read timing signal in order to allow the memory system to transmit data at a higher data rate.

Figure 1:
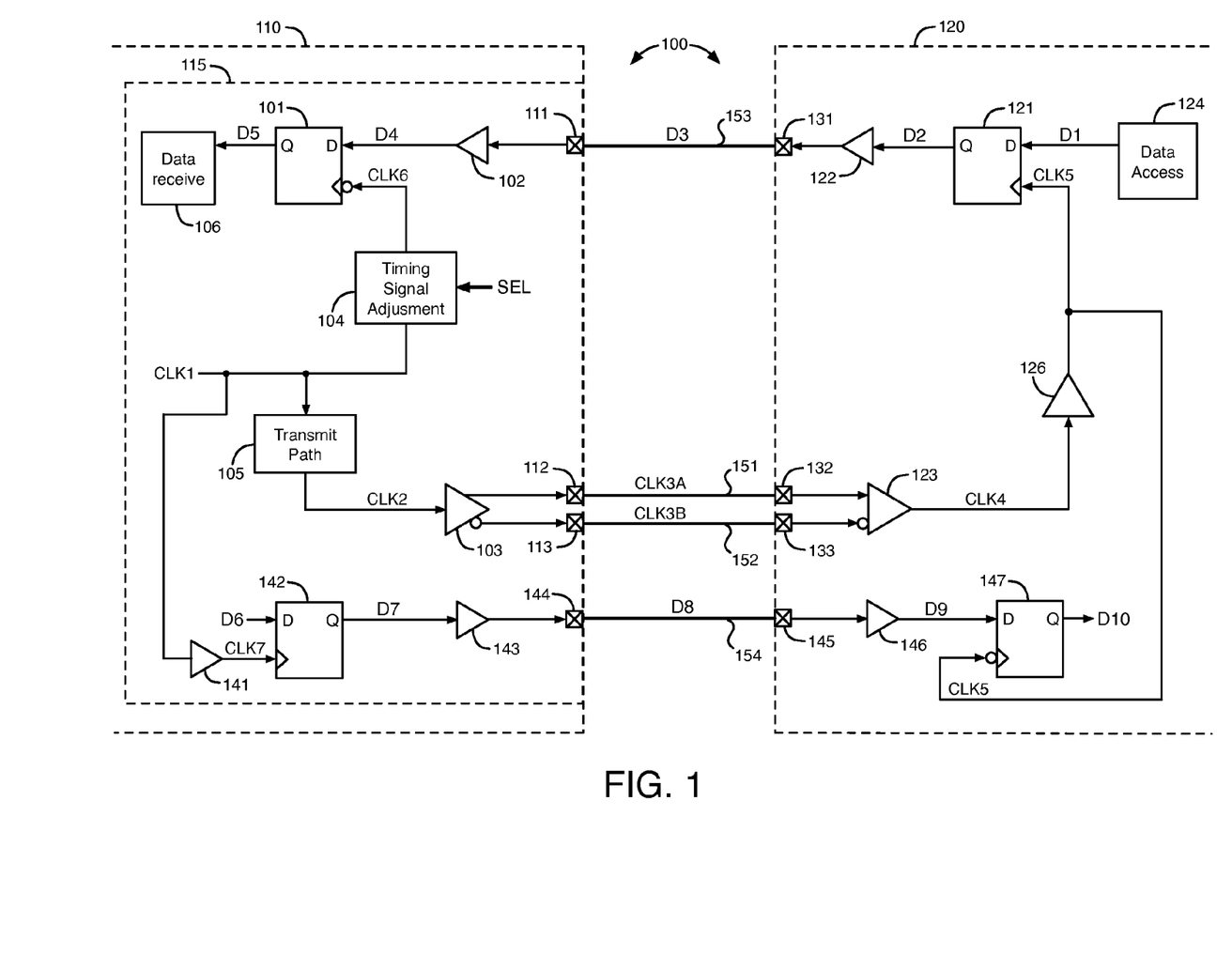
FIG. 1 illustrates an example of a circuit system having a timing signal adjustment circuit for the timing signal used to capture the read data, according to an embodiment of the present invention.

FIG. 1 illustrates an example of a circuit system 100 having a timing signal adjustment circuit for the timing signal used to capture read data, according to an embodiment of the present invention. Circuit system 100 includes a first integrated circuit 110 and a second integrated circuit 120. Only portions of the integrated circuits 110 and 120 are shown in FIG. 1 to simplify the drawing. Integrated circuit 120 is an external device relative to integrated circuit 110.

Integrated circuit 110 includes a controller circuit. The controller circuit in integrated circuit 110 includes an interface circuit 115. Interface circuit 115 in the controller circuit includes D flip-flop circuit 101, buffer circuit 102, buffer circuit 103, timing signal adjustment circuit 104, transmit path circuit 105, data receive circuit 106, buffer circuit 141, D flip-flop circuit 142, buffer circuit 143, and external terminals 111-113 and 144. Integrated circuit 120 includes D flip-flop circuit 121, buffer circuit 122, buffer circuit 123, data access circuit 124, buffer circuit 126, buffer circuit 146, D flip-flop circuit 147, and external terminals 131-133 and 145. The flip-flop circuits are storage circuits.

Integrated circuits 110 and 120 may be any types of integrated circuits. Integrated circuits 110 and 120 may be, for example, programmable integrated circuits, application specific integrated circuits, or any combination thereof. As a specific example, integrated circuit 110 may be a field programmable gate array (FPGA) integrated circuit. As another example, integrated circuit 110 may be a memory controller integrated circuit or may include a memory controller circuit, and integrated circuit 120 may be a memory integrated circuit. As yet another example, integrated circuit 110 is an FPGA that has circuitry configured to function as a memory controller circuit, and integrated circuit 120 is a memory integrated circuit. According to further examples, integrated circuit 120 may be a central processing unit (CPU), microprocessor integrated circuit, or another type of processor integrated circuit.

External terminals 111-113 and 144 of integrated circuit 110 and external terminals 131-133 and 145 of integrated circuit 120 may be any types of external terminals, such as pads, pins, or through-silicon vias (TSVs). In an embodiment, integrated circuits 110 and 120 are stacked three-dimensional (3D) integrated circuit dies that are directly connected together through TSVs in at least one of the integrated circuits and solder bumps. In another embodiment, integrated circuits 110 and 120 are 2.5D integrated circuit dies that are coupled together through TSVs in a silicon interposer and solder bumps that connect the silicon interposer to the integrated circuit dies 110 and 120.

Integrated circuit 110 generates or receives a first timing signal CLK1. Timing signal CLK1 may be, for example, a periodic clock signal. As another example, timing signal CLK1 may be a strobe signal. If timing signal CLK1 is a strobe signal, timing signal CLK1 may be generated from a clock signal. Timing signal CLK1 may be, for example, generated by a phase-locked loop circuit, a delay-locked loop circuit, or a counter circuit. Timing signal CLK1 may be, for example, generated by or routed through programmable logic circuits or other types of circuits that are located in a core region of integrated circuit 110. Alternatively, timing signal CLK1 may be generated in interface circuit 115.

Timing signal CLK1 is provided to an input of timing signal adjustment circuit 104 and to an input of transmit path circuit 105. As examples, transmit path circuit 105 may include logic circuits, such as inverters and multiplexers, and/or analog buffer circuits. Transmit path circuit 105 generates a second timing signal CLK2 based on timing signal CLK1. Transmit path circuit 105 delays timing signal CLK1 to generate timing signal CLK2. The waveform of timing signal CLK2 is a delayed version of the waveform of timing signal CLK1.

Timing signal CLK2 is provided to an input of buffer circuit 103. Buffer circuit 103 generates timing signals CLK3A and CLK3B at its differential outputs based on timing signal CLK2. Buffer circuit 103 buffers timing signal CLK2 to generate a differential buffered timing signal that equals the difference between timing signals CLK3A and CLK3B (i.e., CLK3A-CLK3B).

Timing signals CLK3A and CLK3B are provided to external terminals 112 and 113, respectively. Timing signals CLK3A and CLK3B are transmitted from external terminals 112 and 113 through external conductors 151 and 152 to external terminals 132 and 133, respectively, of integrated circuit 120. Timing signals CLK3A and CLK3B are transmitted from buffer circuit 103 through external terminals 112 and 113, external conductors 151 and 152, and external terminals 132 and 133, respectively, to differential inputs of buffer circuit 123.

Buffer circuit 123 generates a single-ended timing signal CLK4 at its output based on timing signals CLK3A and CLK3B. Buffer circuit 123 buffers the differential timing signal that equals the difference between timing signals CLK3A and CLK3B (i.e., CLK3A-CLK3B) to generate buffered single-ended timing signal CLK4. Timing signal CLK4 is provided to an input of buffer circuit 126. Buffer circuit 126 buffers timing signal CLK4 to generate a buffered timing signal CLK5. Buffer circuit 126 may include a single buffer circuit or multiple component buffer circuits coupled in series to generate timing signal CLK5 based on timing signal CLK4. Timing signal CLK5 is provided to timing inputs of flip-flop circuits 121 and 147.

Data access circuit 124 accesses data that is stored in integrated circuit 120. As an example, data access circuit 124 may access read data from a memory circuit in integrated circuit 120 in response to receiving a command to perform a read operation. The read data is provided from the memory circuit to data access circuit 124 during the read operation. A read operation may refer to any operation to access data stored in integrated circuit 120.

Data access circuit 124 generates a data signal D1 that indicates the read data accessed from the memory circuit during the read operation. Data signal D1 is provided to the D input of flip-flop circuit 121. Flip-flop circuit 121 stores the value of data signal D1 at its Q output in data signal D2 in response to each rising edge of timing signal CLK5 at its timing input.

Data signal D2 is provided to an input of buffer circuit 122. Buffer circuit 122 buffers data signal D2 to generate a buffered data signal D3 at its output. Data signal D3 is transmitted from the output of buffer circuit 122 through external terminal 131, external conductor 153, and external terminal 111 of integrated circuit 110 to the input of buffer circuit 102. Buffer circuit 102 buffers data signal D3 to generate a buffered data signal D4 at its output. Data signal D4 is provided to the D input of flip-flop circuit 101. Data signal D4 indicates the same read data accessed from memory as data signal D1.

Timing signal adjustment circuit 104 generates timing signal CLK6 based on timing signal CLK1. Timing signal adjustment circuit 104 functions as a delay circuit that delays timing signal CLK1 to generate timing signal CLK6. Timing signal CLK6 is provided to the timing input of flip-flop circuit 101. The timing input of flip-flop circuit 101 is inverting. Therefore, flip-flop circuit 101 stores the value of data signal D4 at its Q output in data signal D5 in response to each falling edge of timing signal CLK6 during the read operation. Data signal D5 is provided to an input of data receive circuit 106. Data receive circuit 106 may be, for example, a first-in-first-out (FIFO) buffer circuit or another type of storage circuit that stores the read data indicated by data signal D5 during the read operation. Data receive circuit 106 may, for example, provide the read data indicated by data signal D5 to circuits in a core region of integrated circuit 110.

In an embodiment, data access circuit 124 generates multiple parallel data signals that indicate the read data accessed from the memory circuit during the read operation. Each of the parallel data signals is provided to the D input of a different flip-flop circuit. In this embodiment, each of the flip-flop circuits that receives a data signal from data access circuit 124 stores a value of the data signal in response to timing signal CLK5. The stored values of the data signals are transmitted in parallel data signals to integrated circuit 110 through external terminals of each integrated circuit, external conductors, and buffers coupled to the external terminals. Flip-flop circuits in integrated circuit 110, such as circuit 101, store the values of the parallel data signals in response to timing signal CLK6.

Circuit system 100 can perform operations to store data in integrated circuit 120. As an example, circuit system 100 may perform write operations to store write data in a memory circuit in integrated circuit 120. Integrated circuit 110 transmits write data to integrated circuit 120 during a write operation to store the write data in a memory circuit in integrated circuit 120. During a write operation, a data signal D6 that indicates write data is provided to the D input of flip-flop circuit 142. Buffer circuit 141 buffers timing signal CLK1 to generate timing signal CLK7. Timing signal CLK7 is provided to the timing input of flip-flop circuit 142. Flip-flop circuit 142 stores the value of data signal D6 at its Q output in data signal D7 in response to each rising edge of timing signal CLK7 during the write operation.

Data signal D7 is provided to an input of buffer circuit 143. Buffer circuit 143 buffers data signal D7 to generate a buffered data signal D8 at its output. Data signal D8 is transmitted from the output of buffer circuit 143 through external terminal 144, external conductor 154, and external terminal 145 of integrated circuit 120 to the input of buffer circuit 146. Buffer circuit 146 buffers data signal D8 to generate a buffered data signal D9 at its output. Data signal D9 is provided to the D input of flip-flop circuit 147. Timing signal CLK5 is provided to the timing input of flip-flop circuit 147. The timing input of flip-flop circuit 147 is inverting. Therefore, flip-flop circuit 147 stores the value of data signal D9 at its Q output in data signal D10 in response to each falling edge of timing signal CLK5 during the write operation. Data signal D10 indicates the same write data as data signal D6.

In the embodiment of FIG. 1, circuit system 100 is able to operate in a fully synchronous mode. In the fully synchronous mode, timing signal CLK3A-CLK3B is transmitted along with the write data from integrated circuit 110 to integrated circuit 120 during the write operation. Flip-flop circuit 147 captures the write data during the write operation in response to timing signal CLK5, which is generated based on timing signal CLK3A-CLK3B.

In the fully synchronous mode, a timing signal is not transmitted along with the read data from integrated circuit 120 to integrated circuit 110 during a read operation. As described above, flip-flop circuit 101 captures the read data indicated by signal D4 in response to a timing signal CLK6 that is generated in integrated circuit 110. Timing signal CLK6 is not transmitted from integrated circuit 120 with the read data during a read operation in fully synchronous mode. Also, timing signal CLK6 is not generated from another timing signal that is transmitted from integrated circuit 120 during a read operation in fully synchronous mode. In an exemplary embodiment, timing signal CLK6 may be transmitted only within integrated circuit 110.

If timing signal CLK1 is a periodic clock signal, then timing signals CLK2-CLK7 are also periodic clock signals. If timing signal CLK1 is a strobe signal, then timing signals CLK2-CLK7 are also strobe signals.

The circuits that generate timing signal CLK5 based on timing signal CLK1 may have a significant delay. If the delay provided to timing signal CLK5 relative to timing signal CLK1 is too large, the setup time of flip-flop circuit 101 may not be satisfied during a read operation in fully synchronous mode. Timing signal adjustment circuit 104 adjusts the timing of timing signal CLK6 in order to satisfy the setup time and the hold time of flip-flop circuit 101 during each read operation in fully synchronous mode. Timing signal adjustment circuit 104 can also be used to adjust the timing of timing signal CLK6 in order to allow circuit system 100 to transmit read data at a higher data rate. Timing signal adjustment circuit 104 is an adjustable delay circuit that delays timing signal CLK6 relative to timing signal CLK1. The delay that timing signal adjustment circuit 104 provides to timing signal CLK6 is determined based on a set of select signals SEL. Timing signal adjustment circuit 104 can be used in any system to adjust the timing of a timing signal that is used to capture a value of a signal.

Figure 2:
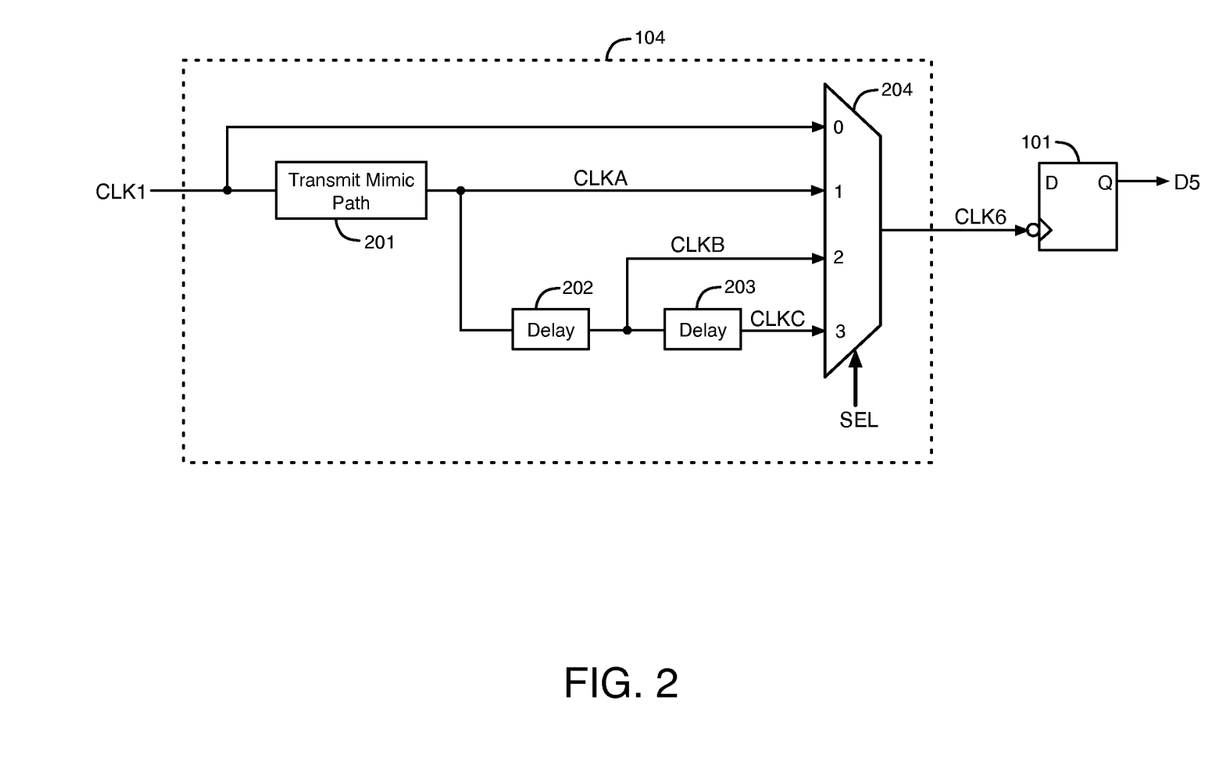
FIG. 2 illustrates an example of the timing signal adjustment circuit of FIG. 1, according to an embodiment of the present invention.

FIG. 2 illustrates an example of timing signal adjustment circuit 104, according to an embodiment of the present invention. In the embodiment of FIG. 2, timing signal adjustment circuit 104 includes transmit mimic path circuit 201, delay circuits 202-203, and multiplexer circuit 204. Multiplexer circuit 204 is a 4-to-1 multiplexer circuit that includes four multiplexing inputs identified as inputs 0-3 in FIG. 2. Select signals SEL are provided to the select inputs of multiplexer circuit 204.

Timing signal CLK1 is provided to the 0 multiplexing input of multiplexer circuit 204 and to the input of transmit mimic path circuit 201. Transmit mimic path circuit 201 delays timing signal CLK1 to generate timing signal CLKA. The waveform of timing signal CLKA is a delayed version of the waveform of timing signal CLK1.

In an embodiment, transmit mimic path circuit 201 has the same circuit structure as transmit path circuit 105 shown in FIG. 1. Because transmit mimic path circuit 201 mimics the circuitry of transmit path circuit 105, transmit mimic path circuit 201 provides the same delay to timing signal CLK1 as transmit path circuit 105. In another embodiment, transmit path circuit 105 includes a multiplexer circuit coupled to its output, and transmit mimic path circuit 201 together with multiplexer circuit 204 have the same circuit structure and the same delay as transmit path circuit 105.

Timing signal CLKA is provided to the 1 multiplexing input of multiplexer circuit 204 and to the input of delay circuit 202. Delay circuit 202 delays timing signal CLKA to generate timing signal CLKB. The waveform of timing signal CLKB is a delayed version of the waveform of timing signal CLKA.

Timing signal CLKB is provided to the 2 multiplexing input of multiplexer circuit 204 and to the input of delay circuit 203. Delay circuit 203 delays timing signal CLKB to generate timing signal CLKC. The waveform of timing signal CLKC is a delayed version of the waveform of timing signal CLKB. Timing signal CLKC is provided to the 3 multiplexing input of multiplexer circuit 204. Multiplexer circuit 204 generates timing signal CLK6 at its output.

Two digital select signals SEL are provided to two select inputs of multiplexer circuit 204. Multiplexer circuit 204 determines which of the timing signals at its 0-3 multiplexing inputs is used to generate timing signal CLK6 at its output based on the binary value of select signals SEL. The four possible binary values of the select signals SEL 00, 01, 10, and 11 correspond to multiplexer circuit 204 providing the timing signals at multiplexing inputs 0, 1, 2, and 3, respectively, to its output as timing signal CLK6. Timing signal CLK6 is provided to the timing input of flip-flop circuit 101.

Select signals SEL are set to a binary value of 00 to program multiplexer circuit 204 to provide the minimum delay to timing signal CLK6. When select signals SEL are set to 00, multiplexer circuit 204 generates timing signal CLK6 based on timing signal CLK1 at multiplexing input 0, and timing signal CLK6 is not delayed by circuits 201-203.

Select signals SEL are set to a binary value of 01 to program multiplexer circuit 204 to generate timing signal CLK6 based on timing signal CLKA at multiplexing input 1. When select signals SEL are set to 01, timing signal CLK6 is delayed by transmit mimic path circuit 201. Timing signal CLK6 is aligned in phase with timing signal CLK2, because the delay of timing signal adjustment circuit 104 equals the delay of transmit path circuit 105 when signals SEL equal 01.

Select signals SEL are set to a binary value of 10 to program multiplexer circuit 204 to generate timing signal CLK6 based on timing signal CLKB at its multiplexing input 2. When select signals SEL are set to 10, timing signal CLK6 is delayed by transmit mimic path circuit 201 and by delay circuit 202. As an example, when select signals SEL equal 10, the delay of timing signal adjustment circuit 104 may equal the delay of transmit path circuit 105 plus the delays of buffer circuits 103 and 123 plus the delay in external conductors 151-152 plus the delay of a first portion of the delay of buffer circuit 126.

Select signals SEL are set to a binary value of 11 to program multiplexer circuit 204 to generate timing signal CLK6 based on timing signal CLKC at its multiplexing input 3. When select signals SEL are set to 11, timing signal CLK6 is delayed by transmit mimic path circuit 201, by delay circuit 202, and by delay circuit 203. As an example, when select signals SEL equal 11, the delay of timing signal adjustment circuit 104 may equal the delay of transmit path circuit 105 plus the delays of buffer circuits 103 and 123 plus the delay in external conductors 151-152 plus a second portion of the delay of buffer circuit 126. The second portion of the delay of buffer circuit 126 is larger than the first portion of the delay of buffer circuit 126 in this example, because the combined delay of delay circuits 202 and 203 is larger than the delay of delay circuit 202.

Figure 3A:
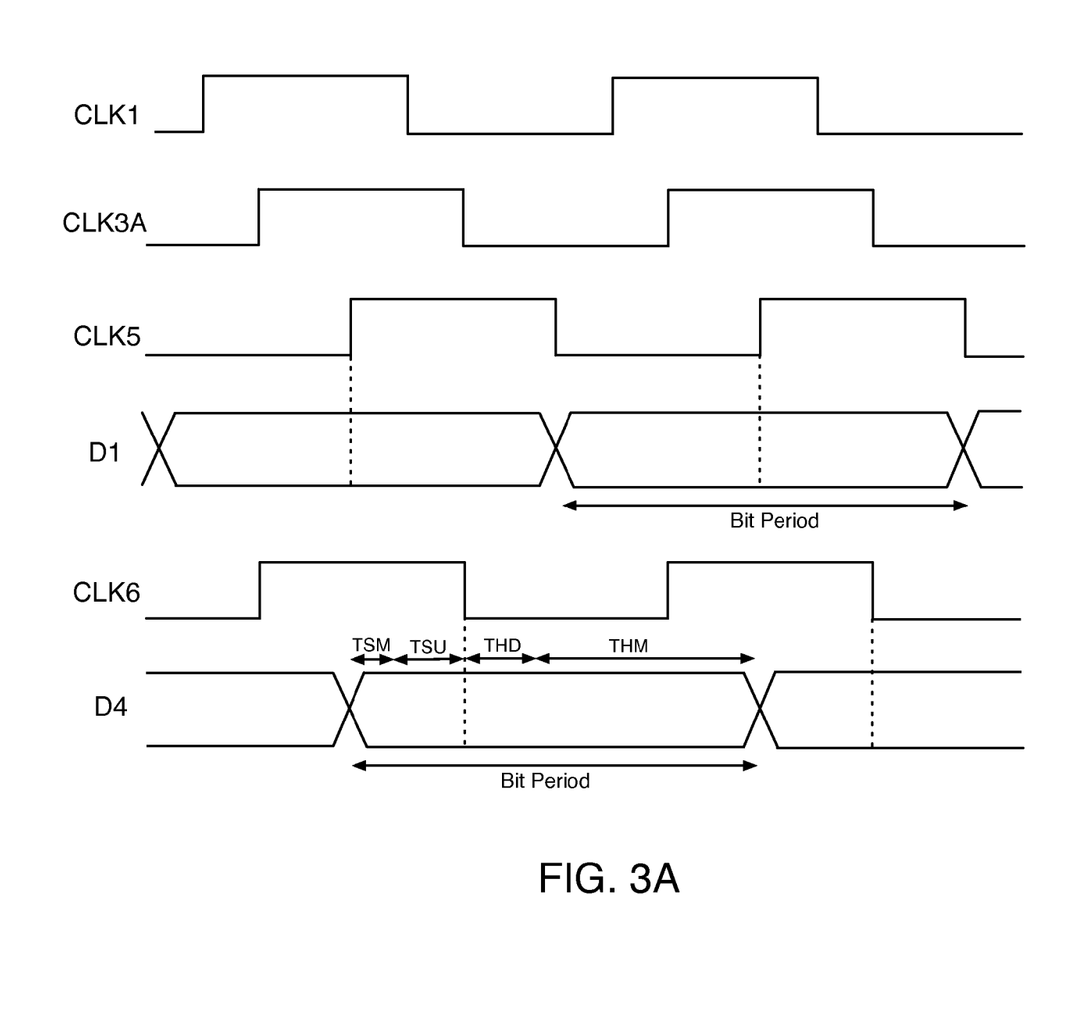
FIG. 3A is a timing diagram that illustrates examples of waveforms of some of the signals shown in FIG. 1, according to an embodiment of the present invention.

FIG. 3A is a timing diagram that illustrates examples of waveforms of some of the signals shown in FIG. 1, according to an embodiment of the present invention. FIG. 3A illustrates exemplary waveforms for signals CLK1, CLK3A, CLK5, CLK6, D1, and D4. As shown in FIG. 3A, the rising edges of timing signal CLK5 are timed to occur at or near the centers of the bit periods of data signal D1 so that flip-flop circuit 121 can accurately store the values of signal D1 in signal D2, as shown by the dotted lines.

In the embodiment of FIG. 3A, select signals SEL are set to 01, and timing signal adjustment circuit 104 generates timing signal CLK6 based on timing signal CLKA. Because the delay of buffer circuit 103 is very small in this embodiment, the rising and falling edges of timing signal CLK3A are approximately aligned with corresponding rising and falling edges of timing signal CLK6. Therefore, the skew of timing signal CLK6 is zeroized with respect to timing signals CLK3A and CLK3B.

In the example of FIG. 3A, the delay that timing signal adjustment circuit 104 provides to timing signal CLK6 causes each falling edge of timing signal CLK6 to occur closer to the beginning of a bit period of data signal D4 than to the end of the same bit period of data signal D4, as shown by the dotted lines. FIG. 3A illustrates example values of the setup time TSU and the hold time THD for flip-flop circuit 101. As shown in FIG. 3A, the time difference between the beginning of a bit period of data signal D4 and the next falling edge of timing signal CLK6 is marginally equal to the setup time TSU of flip-flop circuit 101. Also, the time difference between each falling edge of timing signal CLK6 and the end of the bit period of data signal D4 is greater than the hold time THD of flip-flop circuit 101. Therefore, the setup and hold times of flip-flop circuit 101 are satisfied in this example (with TSU marginally satisfied), and as a result, flip-flop circuit 101 accurately stores the values of signal D4 in signal D5. FIG. 3A also illustrates the timing margin TSM for the setup time and the timing margin THM for the hold time of flip-flop circuit 101.

In some embodiments, the delay that timing signal adjustment circuit 104 provides to timing signal CLK6 causes each falling edge of timing signal CLK6 to occur at or near the center of a bit period of data signal D4. In these embodiments, TSM+TSU equals or approximately equals THD+THM. In some embodiments, the delay that timing signal adjustment circuit 104 provides to timing signal CLK6 causes each falling edge of timing signal CLK6 to occur closer to the end of a bit period of data signal D4 than to the beginning of the same bit period of data signal D4. In these embodiments, the timing margin THM for the hold time of flip-flop circuit 101 is reduced to increase the frequency of the timing signals, but the timing margin THM is greater than zero so that the hold time THD of flip-flop circuit 101 is not violated.

Figure 3B:
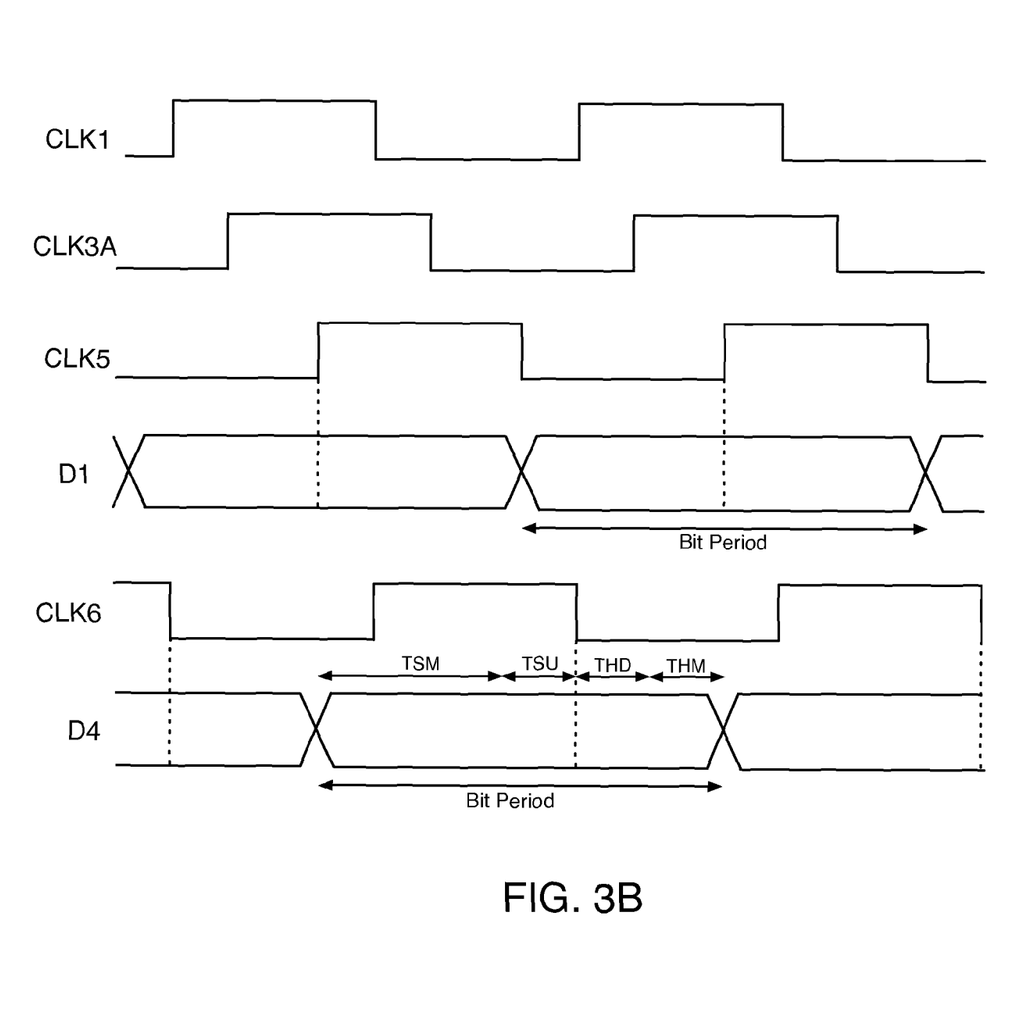
FIG. 3B is a timing diagram that illustrates further examples of waveforms of some of the signals shown in FIG. 1, according to another embodiment of the present invention.

FIG. 3B is a timing diagram that illustrates further examples of waveforms of some of the signals shown in FIG. 1, according to another embodiment of the present invention. FIG. 3B illustrates exemplary waveforms for signals CLK1, CLK3A, CLK5, CLK6, D1, and D4. As shown in FIG. 3B, the rising edges of timing signal CLK5 are timed to occur at or near the centers of the bit periods of data signal D1 so that flip-flop circuit 121 can accurately store the values of signal D1 in signal D2, as shown by the dotted lines.

In the embodiment of FIG. 3B, select signals SEL may be set to 10 or 11, depending on the delays of delay circuits 202-203. Thus, timing signal adjustment circuit 104 may generate timing signal CLK6 based on timing signal CLKB or CLKC in the embodiment of FIG. 3B. The rising and falling edges of timing signal CLK6 occur after corresponding rising and falling edges of timing signal CLK3A, as shown in FIG. 3B. The skew of timing signal CLK6 is negative with respect to timing signals CLK3A/CLK3B and CLK5.

In the example of FIG. 3B, the time difference between the beginning of a bit period of data signal D4 and the next falling edge of timing signal CLK6 is greater than the setup time TSU of flip-flop circuit 101. Also, the time difference between each falling edge of timing signal CLK6 and the end of the bit period of data signal D4 is greater than the hold time THD of flip-flop circuit 101.

If the frequencies of the timing signals CLK1-CLK6 in circuit system 100 are increased, the delay of timing signal adjustment circuit 104 can be adjusted to maintain the setup time TSU and the hold time THD of flip-flop circuit 101. Timing signal adjustment circuit 104 allows the frequencies of timing signals CLK1-CLK6 to be increased, while maintaining the setup and hold times of flip-flop circuit 101 so that flip-flop circuit 101 can capture accurate values of data signal D4 in data signal D5.

Process variations may cause some of the dies that have the designs of integrated circuits 110 and 120 to generate larger delays in timing signals CLK2-CLK5. As an example, if silicon binning is not used to group dies of integrated circuits 110 and 120 that have similar process corners, then the phase of timing signal CLK5 in one circuit system 100 having a fast process corner may vary substantially from the phase of timing signal CLK5 in a second circuit system 100 having a slow process corner.

In addition, many other factors may cause the phase of timing signal CLK5 in one circuit system 100 to vary substantially from the phase of timing signal CLK5 in a second circuit system 100. For example, the jitter in timing signal CLK1, the duty cycle of timing signal CLK1, the noise and crosstalk in the external conductors, and the delay in the interposer may vary substantially between one circuit system 100 and another circuit system 100.

The delay of timing signal adjustment circuit 104 can be independently adjusted in the integrated circuit die 110 in each circuit system 100 as described above to maintain the setup and hold times of flip-flop circuit 101, regardless of process variations or other variations between multiple circuit systems 100.

Timing signal adjustment circuit 104 can adjust the phase of timing signal CLK6 by small increments. Therefore, the timing margins for the setup and hold times of flip-flop circuit 101 can be reduced closer to their minimum values, which allows flip-flop circuit 101 to capture accurate values of data signal D4 at a higher data rate of data signal D4 and at a higher frequency of timing signal CLK6.

In an exemplary embodiment, timing signal adjustment circuit 104 can adjust the delay and the phase of timing signal CLK6 without having a phase-locked loop (PLL) circuit or a delay-locked loop (DLL) circuit. Timing signal adjustment circuit 104 typically requires less circuit die area, less timing analysis, less silicon characterization, and less power than a PLL or DLL circuit. Therefore, timing signal adjustment circuit 104 may be a low cost technique for adjusting the timing of timing signal CLK6.

Because timing signal CLK6 and timing signals CLK2-CLK5 are all generated based on timing signal CLK1, jitter in timing signal CLK1 is tracked in timing signal CLK6, in timing signals CLK2-CLK5, and in data signals D2-D4. Therefore, jitter has less of an impact on the accuracy of the sampled values of data signal D5 generated by flip-flop circuit 101.

Figure 4:
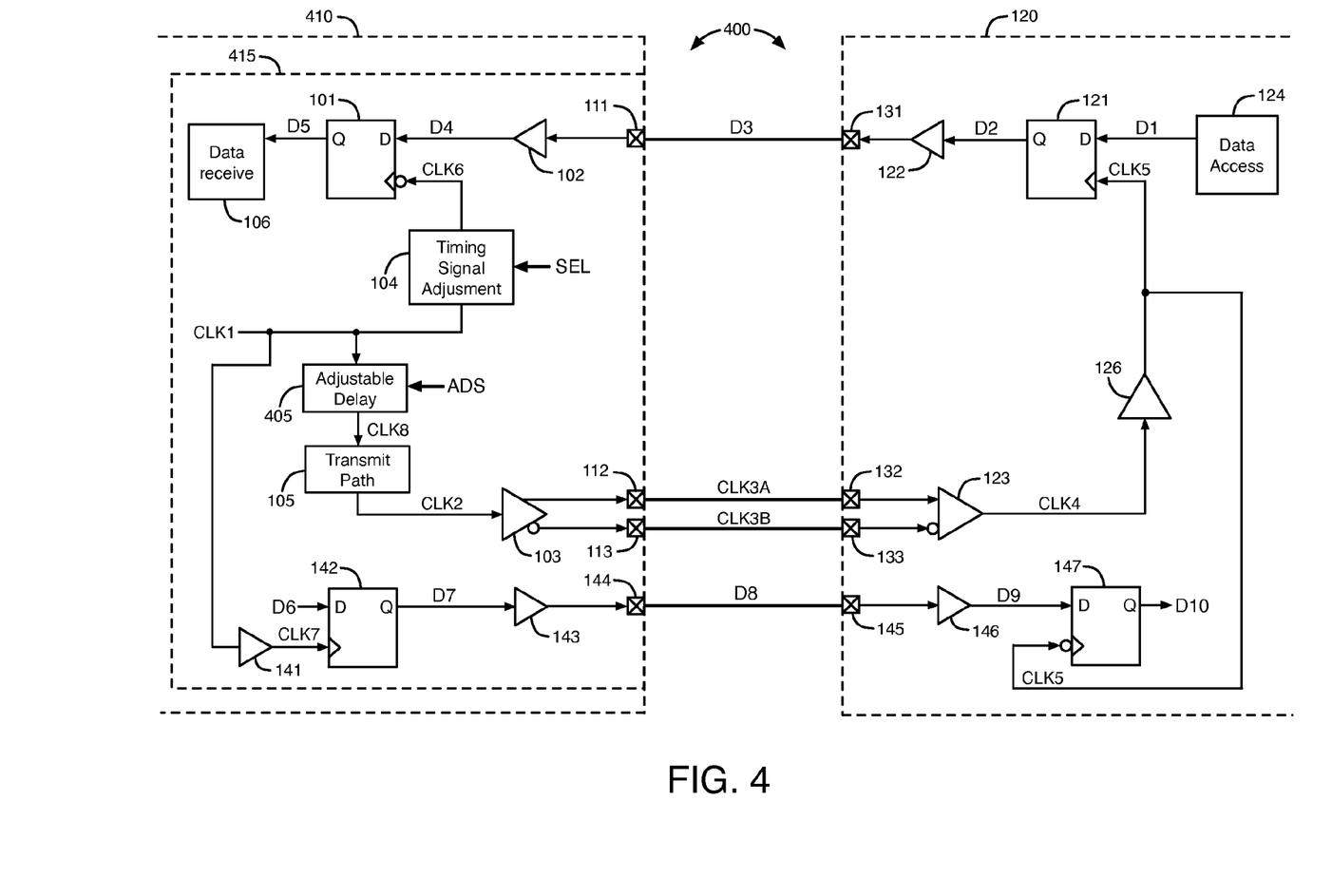
FIG. 4 illustrates an example of a circuit system having an adjustable delay circuit for the timing signal used to transmit the read data, according to an embodiment of the present invention.

FIG. 4 illustrates an example of a circuit system 400 having an adjustable delay circuit for the timing signal used to transmit the read data, according to an embodiment of the present invention. Circuit system 400 includes a first integrated circuit 410 and a second integrated circuit 120. Only portions of the integrated circuits 410 and 120 are shown in FIG. 4 to simplify the drawing. Integrated circuit 120 is shown in and described above with respect to FIG. 1.

Integrated circuit 410 includes a controller circuit. The controller circuit in integrated circuit 410 includes an interface circuit 415. Interface circuit 415 in the controller circuit includes D flip-flop circuit 101, buffer circuit 102, buffer circuit 103, timing signal adjustment circuit 104, transmit path circuit 105, data receive circuit 106, adjustable delay circuit 405, buffer circuit 141, flip-flop circuit 142, buffer circuit 143, and external terminals 111-113 and 144.

In the embodiment of FIG. 4, adjustable delay circuit 405 generates a timing signal CLK8 based on timing signal CLK1. Adjustable delay circuit 405 delays timing signal CLK1 to generate timing signal CLK8. Transmit path circuit 105 generates timing signal CLK2 based on timing signal CLK8 in the embodiment of FIG. 4. Transmit path circuit 105 delays timing signal CLK8 to generate timing signal CLK2. The waveform of timing signal CLK2 is a delayed version of the waveform of timing signal CLK1.

In circuit system 400, timing signals CLK3A, CLK3B, CLK4, CLK5, CLK6, and CLK7 and data signals D1-D10 are generated as described above with respect to FIG. 1. Flip-flop circuit 101 stores the values of data signal D4 at its Q output in data signal D5 in response to the falling edges in timing signal CLK6, as described above with respect to FIG. 1.

In the embodiment of FIG. 4, adjustable delay circuit 405 adds additional delay to timing signals CLK2-CLK5. The additional delay added to timing signal CLK5 causes flip-flop circuit 121 to delay data signal D2, which delays data signals D3-D4. The additional delay added to data signal D4 increases the timing margin THM of the hold time of flip-flop circuit 101 and decreases the timing margin TSM of the setup time of flip-flop circuit 101. Adjustable delay circuit 405 can be used in any system to adjust a timing margin of a circuit that captures a value of a signal.

Adjustable delay circuit 405 provides an adjustable delay to timing signal CLK8. The adjustable delay that adjustable delay circuit 405 provides to timing signal CLK8 is determined by select signals ADS. The binary value of select signals ADS can be varied to change the adjustable delay that adjustable delay circuit 405 provides to timing signal CLK8. The adjustable delay that adjustable delay circuit 405 adds to timing signal CLK8 can be increased to increase the timing margin THM of the hold time of flip-flop circuit 101 and to decrease the timing margin TSM of the setup time of flip-flop circuit 101. The adjustable delay that adjustable delay circuit 405 adds to timing signal CLK8 can be decreased to decrease the timing margin THM of the hold time of flip-flop circuit 101 and to increase the timing margin TSM of the setup time of flip-flop circuit 101.

Figure 5:
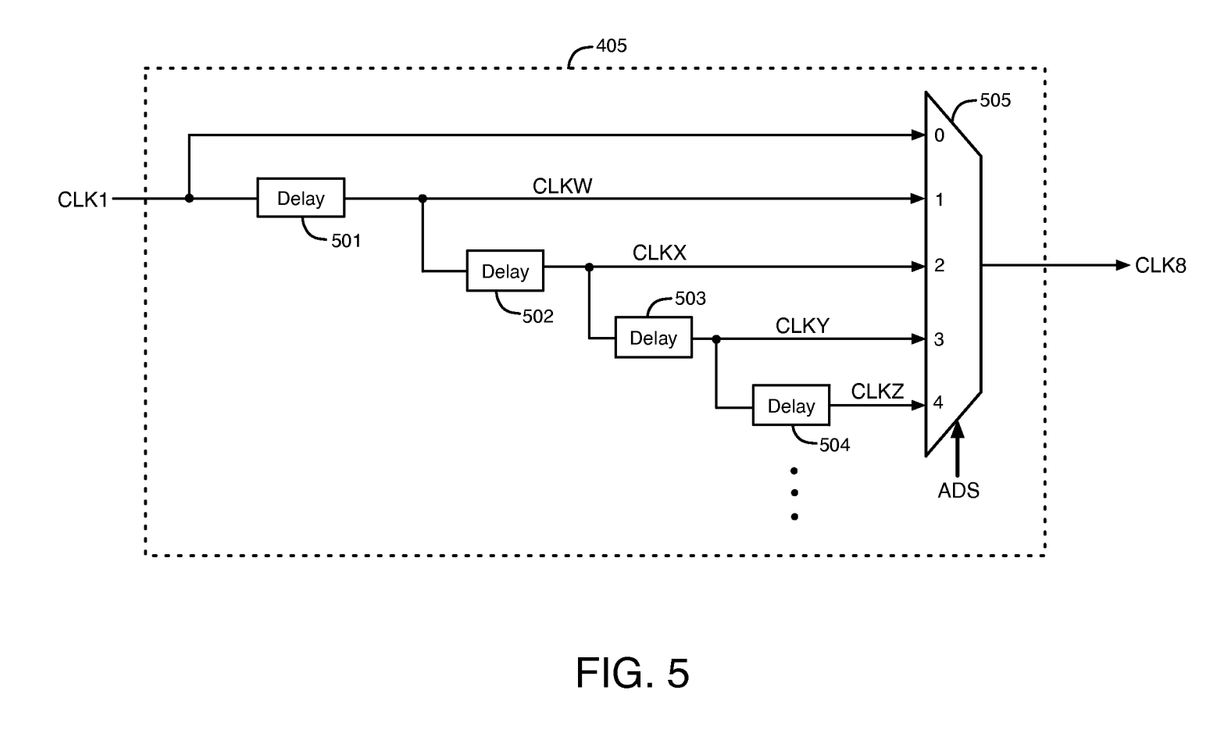
FIG. 5 illustrates an example of the adjustable delay circuit of FIG. 4, according to an embodiment of the present invention.

FIG. 5 illustrates an example of adjustable delay circuit 405, according to an embodiment of the present invention. In the embodiment of FIG. 5, adjustable delay circuit 405 includes a multiplexer circuit 505 and delay circuits, including delay circuits 501-504. Each of the delay circuits may include, for example, a delay chain, such as an even number of inverter circuits coupled together in series.

Delay circuit 501 delays timing signal CLK1 to generate timing signal CLKW. Delay circuit 502 delays timing signal CLKW to generate timing signal CLKX. Delay circuit 503 delays timing signal CLKX to generate timing signal CLKY. Delay circuit 504 delays timing signal CLKY to generate timing signal CLKZ. Timing signals CLK1, CLKW, CLKX, CLKY, and CLKZ are provided to the 0, 1, 2, 3, and 4 multiplexing inputs of multiplexer circuit 505, respectively. Adjustable delay circuit 405 may include additional delay circuits that generate delayed timing signals provided to additional multiplexing inputs of multiplexer circuit 505. Timing signals CLKW-CLKZ are the same type of timing signals as timing signal CLK1 (e.g., clock signals or strobe signals).

Select signals ADS are provided to select inputs of multiplexer circuit 505. Multiplexer circuit 505 determines which of the timing signals at its multiplexing inputs is used to generate timing signal CLK8 at its output based on the binary value of select signals ADS. Multiplexer circuit 505 causes the waveform of timing signal CLK8 to match the waveform of the timing signal selected by select signals ADS while being delayed by the delay of multiplexer circuit 505. Each of the binary values of select signals ADS corresponds to a unique one of the multiplexing inputs of multiplexer circuit 505. Multiplexer circuit 505 generates timing signal CLK8 based on a different one of the timing signals at its multiplexing inputs after each change in the binary value of select signals ADS.

If the delays of the delay circuits 501-504 etc. in adjustable delay circuit 405 are small relative to the period of timing signal CLK1, adjustable delay circuit 405 can generate small variations in the delay provided to timing signal CLK8 based on changes in select signals ADS. In this embodiment, adjustable delay circuit 405 can generate small variations in the timing of data signal D4 in order to make small changes to the timing margins of the setup and hold times of flip-flop circuit 101. Adjustable delay circuit 405 can make changes to the timing of data signal D4 to maintain the setup and hold times of flip-flop circuit 101 after changes in the frequencies of timing signals CLK1 and CLK6 and/or changes in the data rate of data signal D4.

In an alternative embodiment, timing signal adjustment circuit 104 has the circuit structure of adjustable delay circuit 405 as shown in FIG. 5. In this embodiment, the select signals SEL are provided to the select inputs of the instance of the multiplexer circuit 505 in timing signal adjustment circuit 104 instead of select signals ADS, and multiplexer circuit 505 generates timing signal CLK6 at its output. The circuit structure shown in FIG. 5 may allow timing signal adjustment circuit 104 to adjust the delay of timing signal CLK6 in smaller increments than the embodiment of FIG. 2.

Figure 6:
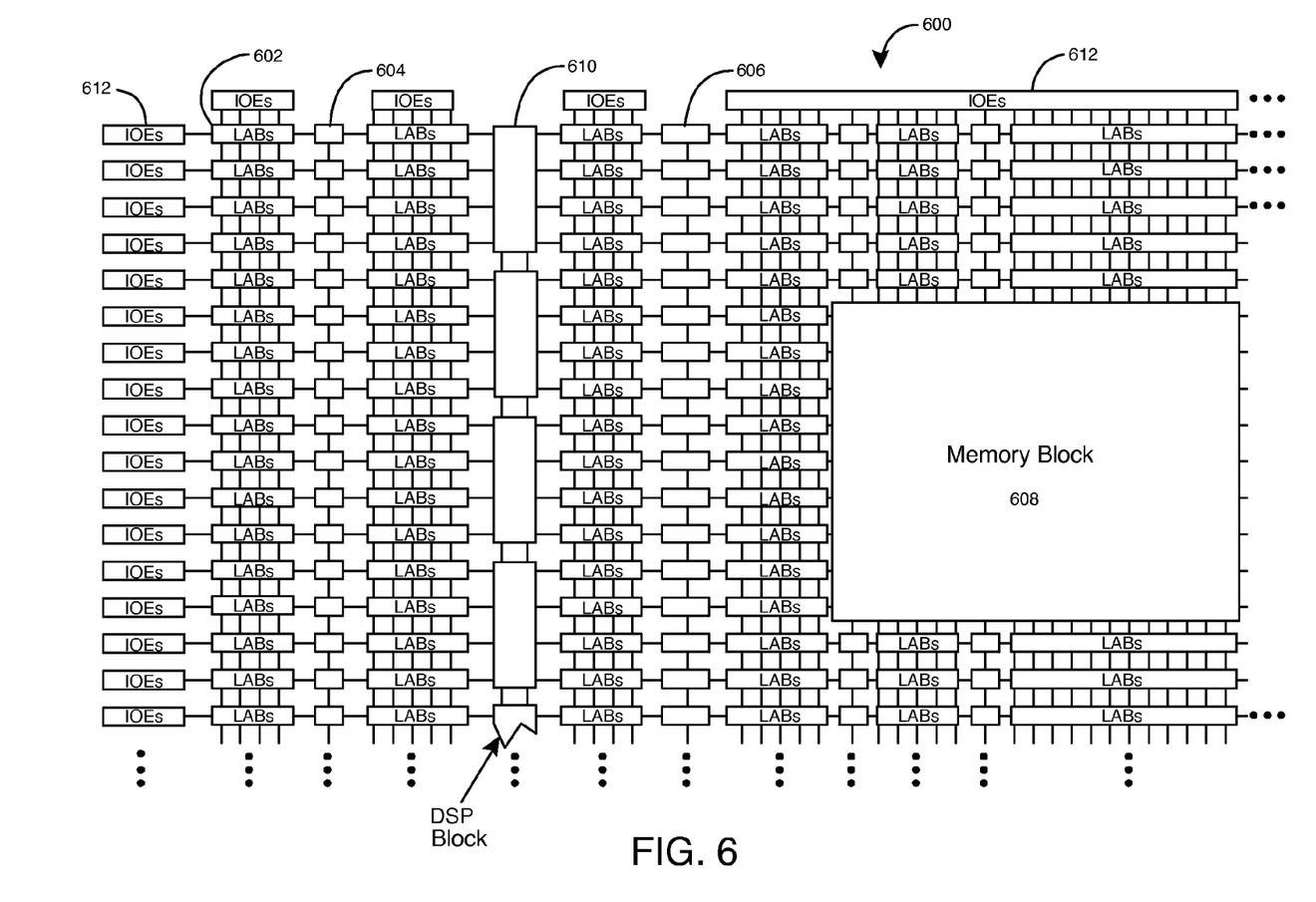
FIG. 6 is a simplified partial block diagram of a field programmable gate array (FPGA) that can include aspects of the present invention.

FIG. 6 is a simplified partial block diagram of a field programmable gate array (FPGA) 600 that can include aspects of the present invention. FPGA 600 is merely one example of an integrated circuit that can include features of the present invention. It should be understood that embodiments of the present invention can be used in numerous types of integrated circuits such as field programmable gate arrays (FPGAs), programmable logic devices (PLDs), complex programmable logic devices (CPLDs), programmable logic arrays (PLAs), application specific integrated circuits (ASICs), memory integrated circuits, central processing units, microprocessors, analog integrated circuits, etc.

FPGA 600 includes a two-dimensional array of programmable logic array blocks (or LABs) 602 that are interconnected by a network of column and row interconnect conductors of varying length and speed. Each of LABs 602 includes multiple (e.g., 10) logic elements (or LEs).

A logic element (LE) is a programmable logic circuit block that provides for efficient implementation of user defined logic functions. An FPGA has numerous logic elements that can be configured to implement various combinatorial and sequential functions. The logic elements have access to a programmable interconnect structure. The programmable interconnect structure can be programmed to interconnect the logic elements in almost any desired configuration.

FPGA 600 also includes a distributed memory structure including random access memory (RAM) circuit blocks of varying sizes provided throughout the array. The RAM blocks include, for example, blocks 604, blocks 606, and block 608. These memory blocks can also include shift registers and first-in-first-out (FIFO) buffers.

FPGA 600 further includes digital signal processing (DSP) circuit blocks 610 that can implement, for example, multipliers with add or subtract features. Input/output elements (IOEs) 612 support numerous single-ended and differential input/output standards. One or more of IOEs 612 may include interface circuit 115. One or more of IOEs 612 may include interface circuit 415. Alternatively, interface circuit 115 or 415 may be in FPGA 600 between two of IOEs 612. FPGA 600 is described herein for illustrative purposes. Embodiments of the present invention can be implemented in many different types of integrated circuits.

Figure 7:
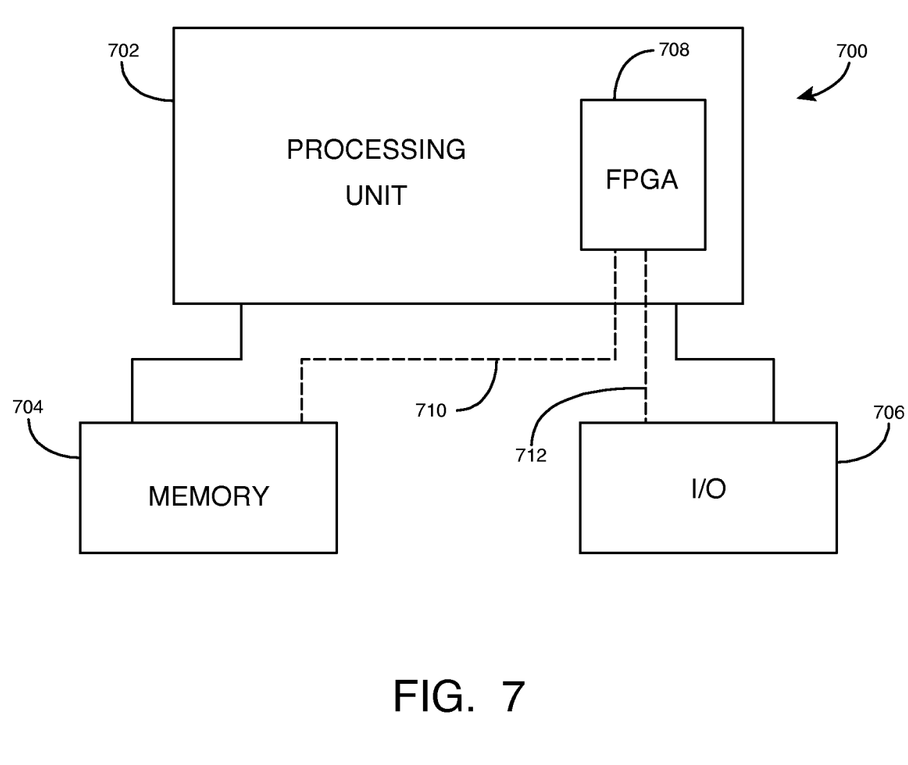
FIG. 7 shows a block diagram of an exemplary digital system that can embody techniques of the present invention.

The present invention can also be implemented in a system that has an FPGA as one of several components. FIG. 7 shows a block diagram of an exemplary digital system 700 that can embody techniques of the present invention. System 700 can be a programmed digital computer system, digital signal processing system, specialized digital switching network, or other processing system. Moreover, such systems can be designed for a wide variety of applications such as telecommunications systems, automotive systems, control systems, consumer electronics, personal computers, Internet communications and networking, and others. Further, system 700 can be provided on a single board, on multiple boards, or within multiple enclosures.

System 700 includes a processing unit 702, a memory unit 704, and an input/output (I/O) unit 706 interconnected together by one or more buses. According to this exemplary embodiment, an FPGA 708 is embedded in processing unit 702. FPGA 708 can serve many different purposes within the system of FIG. 7. FPGA 708 can, for example, be a logical building block of processing unit 702, supporting its internal and external operations. FPGA 708 is programmed to implement the logical functions necessary to carry on its particular role in system operation. FPGA 708 can be specially coupled to memory 704 through connection 710 and to I/O unit 706 through connection 712.

Processing unit 702 can direct data to an appropriate system component for processing or storage, execute a program stored in memory 704, receive and transmit data via I/O unit 706, or other similar functions. Processing unit 702 can be a central processing unit (CPU), microprocessor, floating point coprocessor, graphics coprocessor, hardware controller, microcontroller, field programmable gate array programmed for use as a controller, network controller, or any type of processor or controller. Furthermore, in many embodiments, there is often no need for a CPU.

For example, instead of a CPU, one or more FPGAs 708 can control the logical operations of the system. As another example, FPGA 708 acts as a reconfigurable processor that can be reprogrammed as needed to handle a particular computing task. Alternatively, FPGA 708 can itself include an embedded microprocessor. Memory unit 704 can be a random access memory (RAM), read only memory (ROM), fixed or flexible disk media, flash memory, tape, or any other storage means, or any combination of these storage means.

The foregoing description of the exemplary embodiments of the present invention has been presented for the purposes of illustration and description. The foregoing description is not intended to be exhaustive or to limit the present invention to the examples disclosed herein. In some instances, features of the present invention can be employed without a corresponding use of other features as set forth. Many modifications, substitutions, and variations are possible in light of the above teachings, without departing from the scope of the present invention.

What is claimed is:

1. An integrated circuit comprising:
   a first delay circuit to delay a first timing signal by a first adjustable delay to generate a second timing signal;
   a first buffer circuit to generate a third timing signal for transmission to an external device, wherein the third timing signal is generated based on the first timing signal, and wherein the external device provides data to the integrated circuit based on the third timing signal; and
   a storage circuit to capture the data transmitted from the external device in response to the second timing signal.

2. The integrated circuit of claim 1 further comprising:
   a transmit path circuit to generate a fourth timing signal based on the first timing signal, wherein the first buffer circuit generates the third timing signal based on the fourth timing signal, and wherein the first delay circuit comprises a transmit mimic path circuit that mimics the delay of the transmit path circuit.

3. The integrated circuit of claim 2, wherein the first delay circuit further comprises a multiplexer circuit, a second delay circuit coupled to a first multiplexing input of the multiplexer circuit, and a third delay circuit coupled to a second multiplexing input of the multiplexer circuit, wherein the transmit mimic path circuit is coupled to a third multiplexing input of the multiplexer circuit, and wherein the multiplexer circuit generates the second timing signal.

4. The integrated circuit of claim 1 further comprising:
   a second buffer circuit to provide the data to the storage circuit from an external terminal of the integrated circuit.

5. The integrated circuit of claim 1 further comprising:
   a second delay circuit to delay the first timing signal by a second adjustable delay to generate a fourth timing signal, wherein the third timing signal is generated based on the fourth timing signal.

6. The integrated circuit of claim 5 further comprising:
a transmit path circuit to generate a fifth timing signal based on the fourth timing signal, wherein the first buffer circuit generates the third timing signal based on the fifth timing signal.

7. The integrated circuit of claim 5, wherein the second delay circuit comprises a multiplexer circuit, a third delay circuit coupled to a first multiplexing input of the multiplexer circuit, and a fourth delay circuit coupled to a second multiplexing input of the multiplexer circuit, and wherein the multiplexer circuit generates the fourth timing signal.

8. The integrated circuit of claim 1, wherein the external device provides the data to the integrated circuit based on the third timing signal during a read operation from a memory circuit, and wherein the external device performs a write operation to the memory circuit in response to the third timing signal.

9. The integrated circuit of claim 1, wherein the second timing signal is transmitted only within the integrated circuit.

10. An integrated circuit comprising:
a transmit path circuit to generate a first timing signal based on a second timing signal;
a first buffer circuit to generate a third timing signal for transmission to an external device based on the first timing signal, wherein the external device provides data to the integrated circuit based on the third timing signal;
a first adjustable delay circuit to delay the second timing signal to generate a fourth timing signal, wherein the first adjustable delay circuit comprises a transmit mimic path circuit that mimics a delay that the transmit path circuit provides to the first timing signal; and
a storage circuit to capture the data transmitted from the external device in response to the fourth timing signal.

11. The integrated circuit of claim 10, wherein the first adjustable delay circuit further comprises a multiplexer circuit, a second delay circuit coupled to a first multiplexing input of the multiplexer circuit, and a third delay circuit coupled to a second multiplexing input of the multiplexer circuit, wherein the transmit mimic path circuit is coupled to a third multiplexing input of the multiplexer circuit, and wherein the multiplexer circuit generates the fourth timing signal.

12. The integrated circuit of claim 10, wherein the external device provides the data to the integrated circuit based on the third timing signal during a read operation from memory, and wherein the external device performs a write operation to the memory based on the third timing signal.

13. The integrated circuit of claim 10 further comprising:
a second buffer circuit to provide the data to the storage circuit from an external terminal of the integrated circuit, wherein the storage circuit captures the data in response to the fourth timing signal in a fully synchronous mode.

14. The integrated circuit of claim 10 further comprising:
a second adjustable delay circuit to delay the second timing signal to generate a fifth timing signal, wherein the transmit path circuit generates the first timing signal based on the fifth timing signal.

15. The integrated circuit of claim 14, wherein the second adjustable delay circuit comprises a multiplexer circuit, a third delay circuit coupled to a first multiplexing input of the multiplexer circuit, and a fourth delay circuit coupled to a second multiplexing input of the multiplexer circuit, and wherein the multiplexer circuit generates the fifth timing signal.

16. A method comprising:
delaying a first timing signal to generate a second timing signal using a first adjustable delay circuit in an integrated circuit;
generating a third timing signal for transmission to an external device using a buffer circuit in the integrated circuit, wherein the third timing signal is generated based on the first timing signal, and wherein the external device provides data to the integrated circuit based on the third timing signal; and
storing the data transmitted from the external device in response to the second timing signal using a storage circuit in the integrated circuit.

17. The method of claim 16 further comprising:
generating a fourth timing signal based on the first timing signal using a transmit path circuit,
wherein generating a third timing signal for transmission to an external device using a buffer circuit further comprises generating the third timing signal based on the fourth timing signal using the buffer circuit, and
wherein delaying a first timing signal to generate a second timing signal using a first adjustable delay circuit further comprises delaying the first timing signal using a transmit mimic path circuit in the first adjustable delay circuit that mimics the delay of the transmit path circuit to generate a fifth timing signal.

18. The method of claim 17, wherein delaying a first timing signal to generate a second timing signal using a first adjustable delay circuit further comprises delaying the fifth timing signal using a second delay circuit to generate a sixth timing signal, delaying the sixth timing signal using a third delay circuit to generate a seventh timing signal, and selecting one of the fifth, the sixth, or the seventh timing signals to generate the second timing signal using a multiplexer circuit.

19. The method of claim 16, further comprising:
delaying the first timing signal to generate a fourth timing signal using a second adjustable delay circuit, wherein the third timing signal is generated based on the fourth timing signal.

20. The method of claim 19 further comprising:
generating a fifth timing signal based on the fourth timing signal using a transmit path circuit, wherein the buffer circuit generates the third timing signal based on the fifth timing signal.

* * * * *